(12) United States Patent
Saes

(10) Patent No.: US 9,161,406 B2
(45) Date of Patent: Oct. 13, 2015

(54) LED DRIVER AND LIGHTING APPLICATION FOR WATTAGE CONTROL

(75) Inventor: Marc Saes, Eindhoven (NL)

(73) Assignee: ELDOLAB HOLDING B.V., Son en Breugel (NL)

( * ) Notice: Subject to any disclaimer, the term of this patent is extended or adjusted under 35 U.S.C. 154(b) by 373 days.

(21) Appl. No.: 13/346,066

(22) Filed: Jan. 9, 2012

(65) Prior Publication Data

US 2012/0176064 A1 Jul. 12, 2012

Related U.S. Application Data

(60) Provisional application No. 61/431,240, filed on Jan. 10, 2011.

(51) Int. Cl.
*H05B 37/02* (2006.01)
*H05B 33/08* (2006.01)

(52) U.S. Cl.
CPC .......... *H05B 33/083* (2013.01); *H05B 33/0815* (2013.01)

(58) Field of Classification Search
CPC .... H05B 37/02; H05B 33/08; H05B 33/0803; H05B 33/0896; H02M 3/00; H02M 3/02; H02M 2001/00; H02M 2003/00; H02M 2003/02
USPC ............. 315/209 R, 210, 291, 294, 297, 299, 315/307, 308
See application file for complete search history.

(56) References Cited

U.S. PATENT DOCUMENTS

| | | | |
|---|---|---|---|
| 7,425,803 B2* | 9/2008 | Shao et al. | 315/308 |
| 7,737,643 B2* | 6/2010 | Lys | 315/291 |
| 8,174,212 B2* | 5/2012 | Tziony et al. | 315/309 |
| 8,415,890 B2* | 4/2013 | Kang et al. | 315/219 |
| 8,456,095 B2* | 6/2013 | Huynh | 315/209 R |
| 8,531,128 B2* | 9/2013 | Weaver et al. | 315/291 |
| 8,629,624 B2* | 1/2014 | Chitta et al. | 315/210 |
| 2011/0248640 A1* | 10/2011 | Welten | 315/210 |
| 2013/0127356 A1* | 5/2013 | Tanaka et al. | 315/200 R |

* cited by examiner

*Primary Examiner* — Thuy Vinh Tran
(74) *Attorney, Agent, or Firm* — Browdy and Neimark, PLLC

(57) ABSTRACT

An LED driver for powering an LED fixture is described, the LED driver comprising:
an input terminal for receiving an input power;
a power converter arranged to
receive an input power at an input terminal of LED driver;
convert the input power to an output power for powering the LED fixture
a sensing device for sensing the input power received by the power converter;
a control unit arranged to control an output characteristic of the power converter;
a configuration terminal connected to the control unit;
the control unit further being arranged to:
receive, from the sensing device, a signal representing the sensed input power;
receive, via the configuration terminal, a configuration signal representing a maximum wattage for the LED driver; and
control the output characteristic of the power converter such that the input power as sensed does not exceed the maximum wattage.

23 Claims, 1 Drawing Sheet

LED DRIVER AND LIGHTING APPLICATION FOR WATTAGE CONTROL

FIELD OF THE INVENTION

The invention relates to the field of power consumption management of electrical devices, in particular lighting applications

BACKGROUND OF THE INVENTION

At present, electrical installations of buildings, in particular lighting applications installed, are subjected to power limitations, e.g. indicated as a maximum power consumption per square feet, or Lighting Power Densities, which are represented as Watts per Sq. Feet which are part of building codes that need to be met prior to the use of the electrical installation. In practice, an Authority Having Jurisdiction (AHJ) or building inspector would verify if the total installed wattage of an electrical installation is compliant or acceptable, as required by building code restrictions, or requirements with respect to power consumption. Such a check would in general require verifying the wattage of each device of the electrical installation, e.g. based on the labeling on the devices, adding the total installed wattage and verifying if it meets the power consumption limit.

Such an inspection and subsequent certification of an electrical installation may thus be difficult and time-consuming. Further, from a manufacturer's point of view, it is often cumbersome to design or stock inventory to an electrical installation, e.g. comprising a plurality of lighting applications that makes optimal use of the allowable power consumption. Typically, due to such differences in building designs it is often difficult to manage fixture power requirements and it would require mixing and matching of devices of different wattage in order to comply with a building code requirement, or Lighting Power Densities. In order to provide an optimal match, this could require the design, maintenance and support for a comparatively large range of driver and power supply devices having different power load ratings. In case of LED based lighting applications, comprising one or more LED fixtures powered by an LED driver or ballast, a manufacturer of such application would need to sustain a large range of LED drivers having different wattages.

This could be cumbersome, both with respect to design effort, maintenance and support or turnover stock.

SUMMARY OF THE INVENTION

It would be desirable to provide an LED driver for powering an LED fixture that enables an improved or more efficient way of meeting various building code regulations or enables an easier way of determining an installed wattage of a plurality of lighting devices. Further, it would also be desirable to ensure that, once an installation such as an LED based lighting application has been certified or approved, the maximum power consumption drawn or lighting power density cannot be tampered with or altered unless the electrical driver is removed and replaced risking non compliance to the energy code.

To better address one or more of these concerns, in a first aspect of the invention an LED driver for powering an LED fixture is provided, the LED driver comprising:
  an input terminal for receiving an input power;
  a power converter arranged to
    receive at least part of the input power from the input terminal of LED driver and;
    supply an output power for powering the LED fixture;
  a control unit arranged to control an output characteristic of the power converter or the LED fixture;
  a configuration terminal connected to the control unit; the control unit further being arranged to:
    receive, via the configuration terminal, a configuration signal representing a maximum wattage for the LED driver; and
    control the output characteristic of the power converter while maintaining the input power below the maximum wattage.

In accordance with the first aspect of the present invention, there is provided an LED driver for powering an LED fixture. Typically, an LED driver comprises a power converter converting power received at an input terminal of the LED driver to a suitable output power for powering the LED fixture. As an example, the power as received at the input terminal can e.g. be a mains AC power supply (e.g. 230V, 50 Hz) whereas the LED fixture may require a low voltage DC supply. As an example, the power converter can comprise a buck or boost converter, e.g. preceded by a full- or half-bridge rectifier. In accordance with the invention, the LED driver comprises a power converter arranged to receive at least part of the input power from an input terminal of LED driver and convert at least part of the power received to an output power for powering the LED fixture.

In an embodiment, part of the input power as received at the input terminal can be used for e.g. powering a control unit of the LED driver.

Alternatively, the power converter can be arranged to provide a power supply (e.g. a DC voltage source) for powering a control unit of the LED driver.

In order to adjust the output power as provided by the power converter, e.g. in order to adjust an illumination characteristic of an LED fixture that is powered, the LED driver in general comprises a control unit for controlling the power converter. As such, the control unit e.g. comprising a controller or microprocessor, can e.g. control a switch of the power converter, thereby controlling an output characteristic such as an output current of the power converter.

The LED driver according to the first aspect of the invention further comprises a configuration terminal for receiving a configuration signal representing a maximum wattage (corresponding to a maximum input power) that may be consumed by the LED driver. This wattage should not be confused with the output power as provided by the power converter to the LED fixture. The difference between the power as received at the input terminal of the LED driver, i.e. the total consumed power by the LED driver, and the output power supplied to a LED fixture can e.g. be due to losses occurring in the power converter or the power requirements of the control unit.

In accordance with the present invention, the control unit is further arranged to control the output characteristic of the power converter while maintaining the input power below the maximum wattage. To illustrate this, the control unit can control the power converter to provide, during use, an output power to an LED fixture thereby limiting the output power as provided to a maximum value whereby the input power consumed by the LED driver corresponds to the maximum wattage or allowable power consumption of the driver.

In an embodiment, the input power as consumed by the LED driver can be obtained by applying a sensing device. In such embodiment, the LED driver comprises a sensing device for sensing the input power received by the power converter, whereby the control unit is further arranged to receive, from the sensing device, a signal representing the sensed input power; and control the output characteristic of the power converter based on the sensed input power. Such a sensing device can e.g. comprise a current sensor and a voltage sensor and a computational unit for determining the input power from a sensed current and voltage.

As an alternative, the control unit of the LED driver according to the invention is arranged to calculate an input power estimate based on an operating characteristic of the LED driver, and control the output characteristic of the power converter based on the input power estimate. In such embodiment, there is no need to have additional hardware such as a sensing device. Instead, the control unit can determine an estimate of the power consumed by the LED driver, i.e. the power received via the input terminal, and control the output characteristic of the power converter such that it does not exceed the maximum wattage. In accordance with the invention, the input power estimate is determined based on an operating characteristic of the LED driver. As an example, such operating characteristic can comprise an efficiency characteristic of the power converter. As such, using the efficiency characteristic, the control unit can estimate the power consumption of the LED driver for a given output power provided to the LED fixture. The output power as provided by the power converter to an LED fixture can e.g. be derived from feedback signals from the LED fixture and received by the control unit. Such signals can e.g. represent the actual forward voltage Vf of the Led fixture and/or the current as supplied to the LED fixture. In order to ensure that the input power as estimated does not exceed the allowable wattage of the LED driver, a safety margin can be applied to the efficiency characteristic as e.g. measured or obtained from a manufacturer. As an example, a manufacturer may provide more than one efficiency characteristic, depending on various operating conditions of the LED driver, e.g. depending on characteristics of the input power such as the input voltage amplitude. The efficiency characteristic corresponding to the worst-case conditions may e.g. be implemented to ensure that the input power as estimated does not exceed the allowable wattage. The application of a safety margin may also take the form of applying a maximum to the input power as estimated. By using a safety margin to the input power estimate, one may also take a reduction of the efficiency over time (e.g. due to aging of certain components) into account.

In order to ensure that an allowable wattage of the LED driver is not exceeded, the LED driver according to the invention is thus arranged to determine the input power consumed by the LED driver (either by measurements or calculation) and control the power converter of the LED driver accordingly. As such, determining the input power may realized by means of measurements (using one or more sensing devices), calculations (e.g. performed by the control unit) or by means of a combination of measurements and calculations, whereby the calculations are e.g. applied for incorporating losses of a transformer or rectifier in case such losses are not determined by the measurement.

Typically, the output power of a power converter powering an LED fixture can be controlled by either controlling an amplitude of the output current of the power converter or controlling a duty cycle of the output current, or a combination thereof.

Using the LED driver according to the invention in an LED based lighting application facilitates adjusting the lighting application to meet particular building code requirements such as a maximum wattage. In general, an LED based lighting application as used in a building will comprise a plurality of LED drivers, each driver arranged to power one or more LED fixtures.

Using the LED drivers according to the invention, each driver can be configured such that the consumed power does not exceed a specific wattage which can be set during or prior to installation. As such, the total wattage of the lighting application as a whole can be tailored to meet the building code requirements. In order to implement this, there is no need to mix and match different types of LED drivers e.g. having different wattages, thereby, at best, approximating a maximum total wattage requirement.

By using such an LED driver according to the invention a reduced inventory can be applied at the point of use, saving manufacturers low volume, low turnover stock on drivers. Using the LED driver according to the invention should enable OEMs and integrators not having to stock a wide number of different LED drivers for multiple applications.

As mentioned, the control unit of the LED driver according to the invention is arranged to receive, via a configuration terminal, a configuration signal representing a maximum wattage that may be drawn by the LED driver.

In an embodiment, data representing the maximum wattage may subsequently be stored in a memory unit of the control unit. In such embodiment, the control unit may further be arranged to change the status to "read-only" once a configuration signal representing a maximum wattage is received and stored. More advanced, the control unit can be arranged to overwrite data representing the maximum wattage only when a new value of the maximum wattage is lower than the stored value.

In an embodiment, the data representing the maximum wattage of the LED driver is stored in a (remote) database, accessible by the control unit via the configuration terminal. In such arrangement, the control unit can be arranged to control the power converter to provide an output power only when the database is accessible. Phrased differently, the LED driver will remain inoperable when the database having the maximum wattage data cannot be accessed by the LED driver's control unit.

A similar approach can be applied when an electronic tag such as an RFID tag is used for providing the maximum wattage data. In such arrangement, one can opt to shut down the LED driver when the electronic tag is removed. As such, the tag functions as kind of database that needs to be present in order for the LED driver to operate.

Using such embodiments, it is rendered difficult to tamper with a maximum wattage that has been configured, e.g. to circumvent building code regulations.

As such, by enabling LED drivers to be wattage selective and by locking out further modifications after installation, one can, to a large extent, assure local authorities having jurisdiction that users or buildings owners cannot increase power loads after e.g. receiving utility sponsored rebates.

In accordance with the invention, the maximum wattage the driver may consume, is provided to the control unit via the configuration terminal. Examples of such a terminal may e.g. include a USB port, a network terminal (e.g. of a DALI network), an analogue port, an RF port, and RFID port, etc. . . .

In order to configure the LED driver's maximum wattage, a suitable input device can be coupled to the configuration terminal (e.g. a USB memory stick, an RFID tag) for providing the configuration signal. As yet another example, a configuration resistance can be applied as well. In such arrangement, a particular resistance value may correspond to a particular maximum wattage. By applying the particular resistance to the configuration terminal, the control unit may sense the resistance value (the sensed resistance value thus being the configuration signal) and thus acquire a value of the maximum wattage.

As mentioned, in order to provide the configuration signal a digital device such as a tag can be used. In such arrangement, a dedicated tag, containing data representing a particular wattage, can e.g. be coupled or brought near the LED driver. The control unit can e.g. be configured by coupling the tag to the LED driver whereby, upon removal of the tag, the configured maximum wattage is held in the control unit and, preferably, cannot be altered again. Alternatively, the LED driver may remain inoperable when the tag is removed.

In an embodiment, the configuration terminal is a network terminal enabling the LED driver to be connected to a communication network such as a DALI network.

Such arrangement further facilitates setting or configuring the maximum power consumption of a plurality of LED drivers which can be present in such network. In such arrangement, the configuring of the one or more LED drivers can be performed from a central location, e.g. via a master control unit such as a DALI master or user interface connected/connectable to the network.

In such an arrangement, the maximum wattage of each of the LED drivers or the maximum total wattage of the drivers connected can be easily adjusted, in real time. As such, the maximum wattage can be varied over time by providing the appropriate configuration signal to the LED drivers. As an example, the maximum wattage can thus be varied, e.g. to obtain so-called daylight harvesting whereby less power is consumed during the day compared to the power consumption at night. As a further use of configuring the maximum wattage via a network terminal, it can be mentioned that such embodiment enables to address peak power limiting. By reducing the maximum wattage of the lighting grid; i.e. the assembly of LED drivers connected to a network, total power consumption of a grid can be reduced.

A yet further use would be to increase the maximum wattage of one or more LED drivers in case a failure or malfunction of one or more LED fixtures or drivers. By doing so, the light output of the installed LED fixtures can be increased (thus compensating for the malfunctioning fixtures) while maintaining to the maximum power for the lighting grid.

By e.g. connecting a dedicated user interface to the network, the LED drivers connected can be configured by providing each LED driver with an appropriate configuration signal comprising the maximum wattage of the driver.

Such an interface may also be used during normal operation of network for e.g. logging or monitoring the power consumed by the LED drivers connected. This power consumption may e.g. be measured by a power meter e.g. measuring the mains supply that powers the LED drivers. Alternatively, in an embodiment, the LED drivers may comprise a sensing device for measuring the input power and provide, e.g. via a network terminal, a signal representing the sensed input power to the network for logging or monitoring. In an embodiment, the LED driver according to the invention may further be arranged to provide a signal to the network representing the maximum wattage as received via the configuration terminal. In such arrangement, the control unit of the LED driver can e.g. be arranged to submit such a signal each time a new configuration signal is received. Combined with a logging functionality, this enables the assessment of any changes that have been made to the maximum wattage, e.g. over a one year period. This e.g. enables controlling whether any inadmissible adjustments to the maximum wattage have been made or not.

In an embodiment, the communication between an LED driver and a dedicated user interface arranged to configure the maximum wattage applies some type of encryption or requires some type or authorization. As an example, an LED driver receiving a configuration signal may e.g. only accept the signal if the signal is in a particular encrypted format or if the signal is accompanied by an authorization signal, e.g. comprising a password or identifier of the user interface. As such, one can ensure that the maximum wattage can only be set or adjusted using a particular type of interface which can e.g. be made available to authorities such as building inspectors.

In an embodiment, the LED driver according to the invention comprises a display for displaying the maximum wattage as configured. Such a display allows a visual verification of the wattage of the LED driver as set. Alternatively or in addition, the wattage of the LED driver as set can be made available using dedicated tooling such as a read-out device using RF or IR communication or the like.

Further, such a display or read-out device can be used for displaying or reading the actual power consumed per LED driver or per installation. As such, in an embodiment, the control unit of the LED driver according to the invention is arranged to output (e.g. via the configuration terminal or a network terminal) a signal presenting the actual power consumed. Such signal can e.g. be provided upon request or in a substantially continuous mode.

In an embodiment, the maximum wattage that has been configured or the actual power consumed can be made available for verification via a network terminal. As mentioned, in an embodiment, the configuration terminal may also be a network terminal. The application of a separate terminal for network communication may however be applied as well. In such arrangement a verification of the configured maximum wattage of each LED driver connected to the network can be made.

Note that, as mentioned above, the actual power consumed (i.e. the power received at the input terminal of the LED driver according to the invention can e.g. be determined by a sensing device of the LED driver or can be estimated by the control unit of the LED driver based on characteristics of the driver.

Apart from verifying the configured wattage of the LED drivers, network communication may also be applied to check if there are LED drivers connected to the network that have not been configured yet. In such arrangement, a suitable network interface can inquire which LED drivers are connected (e.g. by some type of polling) to the network and obtain, for each LED driver the status of the maximum wattage configuration.

Further, as the LED driver according to the invention is enabled to determine the actual power that is consumed (e.g. either by measurement or calculation), this information can e.g. be provided in real time to a central panel system enabling a monitoring of the power consumption. As such, building inspectors can be provided with real time data showing current lighting power densities.

These and other aspects of the invention will be more readily appreciated as the same becomes better understood by reference to the following detailed description and considered in connection with the accompanying drawings in which like reference symbols designate like parts.

DETAILED DESCRIPTION OF EMBODIMENTS

Figure 1:
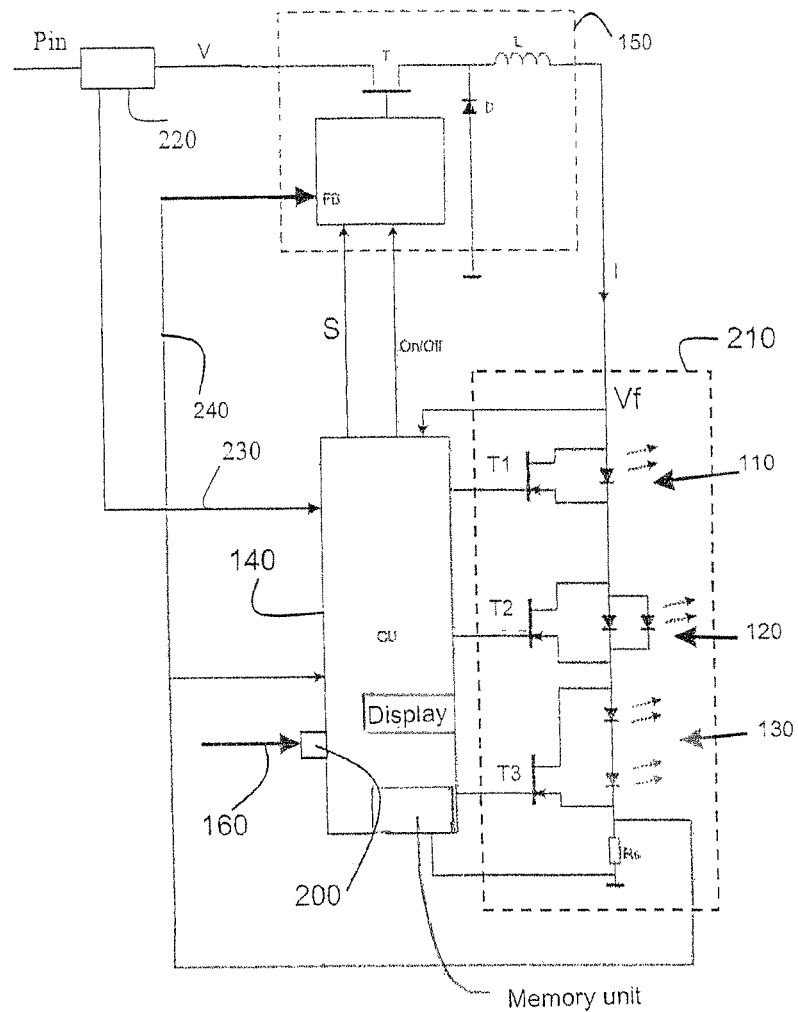
FIG. 1 schematically depicts an embodiment of the LED driver according to the invention.

FIG. 1 depicts an LED driver according to an embodiment of the invention, the LED driver comprising a power converter 150 and a control unit 140. As shown, the power converter 150 is arranged to power an LED fixture 210 comprising three LED units (110,120,130), each comprising one or more LEDs. In general, when referring to an LED fixture, this is understood as comprising at least one LED. In accordance with the invention, the control unit 140 is arranged to control an output characteristic (e.g. the current I as provided to the LED fixture 210). This is schematically depicted by the control signal S as shown. The control signal S can e.g. be applied by the power converter to control the switching element T of the converter thereby controlling the current I as supplied by the power converter to the LED fixture. As such, the control signal can e.g. comprise a current set-point for the power converter whereby the power converter controls the duty cycle of the switching element T in order to obtain the required current set point. In the embodiment as shown, the control unit 140 is further arranged to control a switch assembly of the LED fixture 210, the switch assembly comprising three switches T1, T2 and T3 that can substantially short circuit the respective units 110, 120 and 130. The switches can e.g. comprise a FET or a MOSFET. The power converter 150 can e.g. be, as shown in FIG. 1, a buck, boost, or hysteretic converter or can be another type of converter that enables the provision of an output power to the LED unit. The power converter 50 can e.g. be supplied by a voltage V of an input power source Pin. Such input power source of the LED driver can e.g. be an AC mains supply. Such AC mains supply can e.g. be rectified (using an half bridge or full bridge rectifier (not shown)), thus obtaining a DC power supply for powering the power converter. In the embodiment as shown, the LED driver further comprises a sensing device 220 for sensing the input power as consumed by the LED driver. As such, the sensing device 220 can e.g. comprise a current and voltage sensor and a computation unit for determining the instantaneous power Pin received. Note that this includes both the power as consumed by the power converter (i.e. the losses of the power converter and the output power as supplied to the LED fixture) as the power consumption of the control unit.

It is worth noting that the input power Pin can be measured at various positions. Pin may in an embodiment be measures at a mains input of the LED driver or may e.g. be measured after a transformation of a mains supply (e.g. by a transformer and/or a rectifier). In the latter case, the control unit of the LED driver according to the present invention may be arranged to take any losses in such a transformer or rectifier into account and calculate the input power as consumed on the mains side from the measured input power and the known or estimated losses of the transformation.

In yet another embodiment, the power as consumed by the LED driver, e.g. received via the input terminal configured as a mains input, is determined by calculation. In such embodiment, the control unit 140 of the LED driver is arranged to calculate an input power estimate based on an operating characteristic of the LED driver. In accordance with the invention, the control unit 140 comprises a configuration terminal 200 at which a configuration signal 160, representing a maximum wattage of the LED driver can be received.

The configuration terminal can be any type of terminal suitable for receiving an input signal (representing the maximum wattage of the driver) and providing the signal to the control unit. Examples are an analogue input port, a USB interface port, an RF or IR port.

In an embodiment of the present invention, the data representing the maximum wattage can be stored in a memory unit of the control unit 140 or can be stored in a database which remains accessible to the control unit.

In order to avoid tampering with the maximum wattage of the LED driver once it has been configured, several measures can be taken.

In an embodiment, the control unit 140 is arranged to turn the LED driver off (e.g. by turning the power converter off) when the data representing the maximum wattage (as e.g. stored in a database or an electronic tag mounted or connected to the LED driver) is not available. Therefore, in an embodiment, the control unit 140 can be equipped to provide an On/Off signal to the converter 150 in order to turn the power converter on or off, as shown in FIG. 1.

Further, in order to reduce the possibilities of adjusting the maximum wattage of the LED driver once configured, the control unit can be arranged to prohibit replacement of the stored data by data representing a higher wattage or the control unit can be arranged to prohibit replacement of the stored data at all.

As such, utility representatives will have greater confidence knowing that the LED driver as used, cannot go back to higher wattages. As such, so-called "snapback" where a user either due to dissatisfaction with energy savings measures or due to product reaching end of life or due to too high an impact on lighting conditions wishes to install or go back to older more inefficient technology, can be prohibited, or the user is forced to go through formal channels (such as the building authorities) to have the wattage adjusted.

Further, the use of an LED driver according to the invention, i.e. enabling the maximum allowable wattage to be configured, may allow OEMs to control the power consumption on projects where lower power densities are required, e.g. for local lighting codes such as ASHRAE 90.1, US Green Building initiatives or local ordinances, without having to apply a variety of LED drivers having different ratings. Using the LED drivers according to the invention, OEMs can deliver different, fine tuned LED drivers for each customer, without having to have a large variety of LED drivers in stock.

In order to establish the allowable operating range (allowed by the maximum wattage as configured), the control unit of the LED driver may, during an initial start-up of the driver, control and monitor the power as supplied to the LED fixture (i.e. the output power as provided by the power converter), e.g. by gradually increasing the current I as provided until the maximum wattage (i.e. the allowable input power of the LED driver) or a user defined illumination setpoint is obtained. This initial start-up procedure can be performed as a soft start of the LED driver. Such a start-up procedure may result in establishing an allowable operating range in terms of output current I of the power converter and/or forward voltage Vf of the LED assembly as shown in FIG. 1. In this respect, it is worth noting that the output power as consumed by the LED fixture both depends on the current I as provided and the forward voltage Vf of the LED fixture, the forward voltage Vf a.o. depending on the number of LEDs connected in series.

In order to provide feedback on either the current or the forward voltage Vf, the control unit 140 or the power converter 150 may receive input signals from the LED fixture. In the embodiment as shown, a voltage over resistance Rs of the LED fixture can be applied as a feedback 240 to the control unit 140 and/or to the power converter 150 (inputted at a terminal FB of the converter 150), the voltage representing the current through the LED fixture and can thus be applied to control the switching element T of the converter, e.g. based on a difference between the desired current (represented by the control signal S) and the actual current (represented by the voltage over resistance Rs). Similarly, an input signal representing the forward voltage Vf as shown can be provided to the control unit. Using such feedback from the LED fixture may enable the control unit 140 to determine the actual output power as provided to the LED fixture by the power converter 150. In an embodiment of the LED driver according to the invention, the control unit 140 may further determine an input power estimate based on this output power and known characteristics of the LED driver, such as an efficiency characteristic of the power converter and the power consumption of the control unit. As such, the control unit can establish which operating range (with respect to supplied current I and forward voltage Vf) of the output power of the power converter is allowable in order not to exceed the maximum wattage that can be consumed by the LED driver. In this respect, it can be noted that an adjustment of the current I as supplied to the LED fixture can be realised by changing the amplitude of the current as provided or by changing the duty cycle at which the current is provided, or a combination of both. By changing the amplitude or duty cycle of the current, the control unit can adjust the illumination characteristic of the LED fixture based on a set point as e.g. received via a user interface.

It may further be noted that the feedback of the current and/or forward voltage of the LED fixture may not be required in order to determine the output power of the power converter. As an alternative, the LED driver according to the invention may be provided with operating characteristics of the LED fixture such as a nominal forward voltage or a forward voltage characteristic. Such characteristic, e.g. combined with a current set point as provided to the power converter, may enable the control unit 140 to determine the output power of the power converter 150.

In an embodiment, the LED driver according to the invention may comprise multiple output terminals for providing output power to multiple LED fixtures. In such arrangement, the LED driver can comprise multiple power converters for providing output power to respective multiple output terminals. In such arrangement, the power converters can be controlled by several co-operating control units or by a common control unit such as control unit 140 of FIG. 1. In case such an LED driver is applied to power multiple LED fixtures, the control unit can be arranged to control the power supplied to the multiple LED fixtures, e.g. via in a balanced manner, e.g. substantially evenly distributed over the LED fixtures, e.g. by controlling each power converter to supply the same manner. As will be understood, other distribution schemes of the output power at the multiple output terminals are however feasible as well. As an example, a particular ratio can be maintained between the output power of the multiple output terminals. As a further example, some output terminals may have a higher priority then others; as such, ambient lighting may be reduced to a larger extend than task lighting or ambient lighting may be reduced to a larger extend than emergency lighting.

In an embodiment, the LED driver according to the invention is arranged to output the configured maximum wattage such that it can be verified.

This can e.g. be accomplished using an electronic tag capable of receiving a signal representing the configured maximum wattage and displaying the maximum wattage. Similarly, the actual power consumed (either measured or calculated) or the average power consumption over e.g. the last hour, may be displayed as well. Suitable means of communication between such a tag and the control unit of the LED driver are RF or near field RF or optical communication e.g. using IR. Such electronic tag for receiving the configured maximum wattage can also be incorporated in a portable read-out unit which can be used during building inspection. Alternative or in addition, the LED driver itself can comprise a display for displaying the configured maximum wattage.

In an embodiment, the configuration terminal 200 of the LED driver according to the invention may be configured to output a signal representing the configured maximum wattage. Alternatively, a dedicated terminal for outputting the signal is feasible as well.

Figure 2:
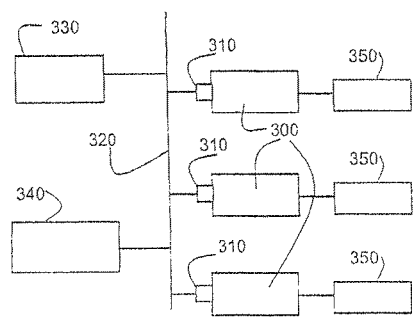
FIG. 2 schematically depicts a plurality of LED drivers according to the invention arranged in a network.

In an embodiment, the configuration terminal of the LED driver according to the invention is a network terminal enabling the LED driver to be connected to a communication network such as a DALI network. In FIG. 2, such a network comprising a plurality of LED drivers according to the invention is schematically shown. In FIG. 2, a plurality of LED drivers 300 according to the invention is schematically shown, together with a plurality of LED fixtures 350 to be powered. The LED drivers 300 as shown comprise a network terminal 310 for connecting to a network 320, e.g. a DALI network. In case the network terminal 310 is also arranged to operate as the configuration terminal of the LED driver, the configuration signal representing the maximum wattage can also be provided to the LED driver 300 via the network 320. Such arrangement further facilitates setting or configuring the maximum power consumption of the plurality of LED drivers 300 which can be present in such network 320. In such arrangement, the configuring of the one or more LED drivers can be performed from a central location, e.g. via a master control unit 330 such as a DALI master or a dedicated user interface 340 connected/connectable to the network 320. In such arrangement, the configuration of the maximum wattage can be adjusted more easily and dynamically (in real time or e.g. using a predetermined schedule describing the maximum wattage over a certain period such as a day or a week).

By e.g. connecting a dedicated user interface 340 to the network 320, the LED drivers 300 connected can be configured by providing each LED driver with an appropriate configuration signal comprising the maximum wattage of the driver. Known communication protocols such as DMX, DALI, uni/o or others can be used in such network environment for configuring the appropriate wattage limit of each LED driver. Such network configuration may further enable one or more of the following functionalities:

inquiry about the total wattage of the configured LED drivers present on the network;
    inquiry about which LED drivers have been configured with respect to a maximum wattage;
    performing a power-sweep in the network whereby all LED drivers are inquired and the maximum consumed power is determined by applying the maximum permissible current and forward voltage operating state of the LED fixtures connected. As a result of such a power-sweep, the total installed power of the LED drivers connected to the network can be determined. If this installed power exceed the maximum permissible power consumptions, the maximum wattage of one or more LED drivers can be limited by providing the selected LED drivers by providing a configuration signal representing the maximum wattage to each of the selected LED drivers, via the network terminal of the drivers.

In this respect, it can be mentioned that the maximum power consumption of the LED driver or drivers may vary over time, e.g. depending on the power consumption of other appliances (e.g. coolers) or may vary due to a variation of the power that can be generated and distributed by the utility company.

Using the network configuration one can also determine whether all LED drivers are properly connected to the network by inquiring the LED drivers for a response.

In order to implement any of the aforementioned functionalities, a dedicated user interface 340 comprising a network terminal for connecting to the network and a read-out unit can be used.

With respect to advantages obtainable using the LED drivers according to the invention, the following can further be mentioned:

the LED driver according to the invention enables a more exact maximum wattage of the LED driver, matching building requirements.

Use of the LED drivers according to the invention in an installation enables the use of LED drivers having a standard wattage wherein the configuration of the LED driver limits the actual wattage that can be consumed, thus saving the additional costs of applying dedicated LED drivers, rendering the installation more homogeneous and modular.

A subsequent replacement of LED fixtures of the installation by LED fixture e.g. having an improved topology (e.g. having less LEDs that have an improved efficiency and require a higher current), does not require a new configuration of the maximum wattage. Note that in such case, it may however be required to redo the initial start-up sequence of the LED driver in order to establish an allowable range for the output power, e.g. an allowable range for the output current for a given forward voltage of the LED fixture.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language, not excluding other elements or steps). Any reference signs in the claims should not be construed as limiting the scope of the claims or the invention.

The mere fact that certain measures are recited in mutually different dependent claims does not indicate that a combination of these measures cannot be used to advantage.

The term coupled, as used herein, is defined as connected, although not necessarily directly, and not necessarily mechanically.

A single processor or other unit may fulfil the functions of several items recited in the claims.

The invention claimed is:

1. An LED driver for powering an LED fixture, the LED driver comprising:
    an input terminal for receiving an input power;
    a power converter arranged to
        receive at least part of the input power from the input terminal of LED driver and;
        supply an output power for powering the LED fixture;
    a control unit arranged to control an output characteristic of the power converter;
    a configuration terminal connected to the control unit;
    the control unit further being arranged to:
        receive, via the configuration terminal, a configuration signal representing a maximum allowable input power received via the input terminal, the configuration signal being settable prior to and after installation of said LED driver; and
        control the output characteristic of the power converter while maintaining the input power at or below the maximum allowable input power.

2. The LED driver according to claim 1 further comprising a sensing device for sensing the input power received by the power converter; the control unit further being arranged to:
    receive, from the sensing device, a signal representing the sensed input power; and
    control the output characteristic of the power converter based on the sensed input power.

3. The LED driver according to claim 1 wherein the control unit is arranged to:
    calculate an input power estimate based on an operating characteristic of the LED driver or LED fixture; and
    control the output characteristic of the power converter based on the input power estimate.

4. The LED driver according to claim 3 wherein the control unit is arranged to calculate the input power estimate based on an efficiency characteristic of the power converter.

5. A lighting network comprising a plurality of LED drivers according to claim 3 and a communication network connecting the plurality of LED drivers.

6. The lighting network according to claim 5 further comprising a user interface for providing the configuration signal representing the maximum allowable input power for the plurality of LED drivers.

7. The lighting network according to claim 6 wherein the user interface is arranged to query the plurality of LED drivers.

8. The lighting network according to claim 7 wherein the user interface is arranged to:
    send a request to each of the plurality of LED drivers and receive in response a signal representing the maximum allowable input power of the LED drivers.

9. The lighting network according to claim 8, further comprising a plurality of LED fixtures, each fixture arranged to be powered by a respective one of a plurality of LED drivers.

10. The lighting network according to claim 9 wherein the user interface is arranged to perform a power-sweep of the network, the power-sweep comprising:
    sending a request to each of the plurality of LED drivers to determine the maximum power consumable;
    determine, by each of the plurality of LED drivers, the maximum consumable power by applying the maximum permissible current and forward voltage to the LED fixtures connected and
    provide, by the LED drivers, a signal representing the maximum consumed power to the user interface.

11. The LED driver according to claim 5, wherein the network is a DALI network.

12. The LED driver according to claim 1, wherein the configuration terminal is further configured as a network terminal for communicating with a network.

13. The LED driver according to claim 12, wherein the control unit of the LED driver is arranged to provide a signal representing the maximum allowable input power to the network.

14. The LED driver according to claim 12, wherein the network is a DALI network.

15. The LED driver according to claim 1, further comprising a network terminal for communicating with a network.

16. The LED driver according to claim 15, wherein the network is a DALI network.

17. The LED driver according to claim 1, further comprising a display for indicating the maximum allowable input power.

18. The LED driver according to claim 1, wherein the control unit is arranged to store data representing the maximum allowable input power in a memory unit of the LED driver.

19. The LED driver according to claim 18 wherein the control unit is arranged to change a status of the memory unit to READ-ONLY once the data is stored.

20. The LED driver according to claim 1, wherein the control unit is arranged to retrieve the configuration signal from a database.

21. The LED driver according to claim 20 wherein the control unit is arranged to control the power converter depending on the accessibility of the database.

22. The LED driver according to claim 1, wherein the control of the output characteristic of the power converter is prohibited when no configuration signal has been received.

23. Method of powering an LED fixture by an LED driver, the method comprising:
    receiving a configuration signal representing a maximum allowable input power received via an input terminal of the LED driver;
    sensing a signal representing an input power of the LED driver or determining an input power estimate; and
    controlling an output power of the LED driver for powering the LED fixture thereby maintaining the sensed input power or the input power estimate at or below the maximum-allowable input power,
wherein the configuration signal is settable at any time prior to and after installation of the LED driver and LED fixture.

* * * * *